United States Patent [19]

Chen

[11] Patent Number: 4,658,287
[45] Date of Patent: Apr. 14, 1987

[54] MOS IMAGING DEVICE WITH MONOCHROME-COLOR COMPATIBILITY AND SIGNAL READOUT VERSATILITY

[75] Inventor: Cheng-wei Chen, Santa Clara, Calif.

[73] Assignee: Fairchild Camera and Instrument Corp., Mt. View, Calif.

[21] Appl. No.: 584,855

[22] Filed: Feb. 29, 1984

[51] Int. Cl.$^4$ .................. H04N 9/077; H04N 3/15; H04N 5/335; H04N 9/07

[52] U.S. Cl. ........................... 358/48; 358/44; 358/212; 358/213

[58] Field of Search .............. 358/213, 41, 43, 44, 358/48, 909, 212; 357/24 LR

[56] References Cited

U.S. PATENT DOCUMENTS 4,553,159  11/1985  Moraillon .................. 358/44

FOREIGN PATENT DOCUMENTS

| 3305027 | 9/1983 | Fed. Rep. of Germany | 358/48 |
| 79430 | 7/1978 | Japan | 358/48 |
| 97781 | 7/1980 | Japan | 358/48 |
| 50881 | 3/1983 | Japan | 358/48 |

Primary Examiner—James J. Groody
Assistant Examiner—Randall S. Svihla
Attorney, Agent, or Firm—Ciotti & Murashige

[57] ABSTRACT

A monochrome or color imager having interlaced, non-interlaced or pseudo-interlaced readout utilizing pixels arranged in groups forming equilateral triangles which are interleaved. Separate vertical shift registers driven by different clock signals to implement different forms of interlaced, non-interlaced and pseudo interlaced signal readout are located on each side of the rectangular array and are coupled to alternating row address lines and different groups of column lines in the array. The clock signals driving each shift register can be controlled to select monochrome or color operation in one of the above noted modes of readout. A horizontal shift register is connected to the gates of MOS coupling transistors which couple the column or bit lines of the array to a pair of monochrome outputs, while a second shift register is connected to the gates of MOS coupling transistors which couple the column or bit lines of the array to a trio of color outputs for color output signals. Either horizontal shift register can be disabled while the other is operating to enable either color or monochrome operation. For color operation a color separation filter must be added thereby preventing monochrome operation until the filter is removed.

19 Claims, 6 Drawing Figures

MOS IMAGING DEVICE WITH MONOCHROME-COLOR COMPATIBILITY AND SIGNAL READOUT VERSATILITY

BACKGROUND OF THE INVENTION

The invention relates to the field of video imaging and, more particularly, to the field of MOS imaging devices.

In the past, video imaging has been done by several different types of sensors including the image orthicon vacuum tube. These devices were expensive and bulky and were subject to damage under certain conditions such as when the camera is pointed directly at the sun.

To overcome some of these problems, a search began for an integrated circuit imaging device. With the advent of metal-oxide-semiconductor (MOS) technology for integrating active devices such as transistors and photodiodes onto a silicon substrate, MOS imaging devices were developed. The structure and architecture of these devices is, by now, well-known. For example, a solid state image pickup device having photoelectric elements each of which includes an MOS field effect transistor is taught in U.S. Pat. No. 4,143,389. An improved version of this cell is taught in U.S. Pat. No. 4,155,094 wherein a PN diode is used to create the photoelectric effect hole-electron pairs and an MOS diode is used to store the charge so generated. An architecture for reading out the data from an array of such cells is taught in U.S. Pat. No. 4,316,205. The '205 patent teaches vertical and horizontal switching transistors which address the photodiodes and shift registers which constitute vertical and horizontal scanning circuits for turning the switching transistors on and off. Another architecture wherein charge transfer devices are used for the vertical and horizontal scanning circuits is taught in U.S. Pat. No. 4,349,743.

Hitachi Ltd. of Japan recently announced a color MOS imager in a paper by M. Aoki, H. Ando, S. Ohba, I. Takemoto, S. Nagahara, T. Nokano, M. Kubo and T. Fujita entitled "⅔ Format MOS Single Chip Color Imager", published in the IEEE proceedings of the Electron Devices Meeting of August, 1980, Vol ED 27, #8, pp. 1676–1687. This device utilized four primary color video signal outputs from each of four pixel elements arranged into square areas on the substrate. One horizontal and one vertical shift register is used for reading data from the array.

Hitachi also manufactures another MOS imager under the part designation HE 98222 which has an organization partially similar to that of the invention. However, this part is only capable of black and white video signal generation because of its organization which provides only two output lines.

Major modifications would have to be made to both the HE 98222 and the structure taught in the paper by Aoki et al to achieve the option of either monochrome or color operation in the variety of interlace and non-interlace modes available when using the structure of the invention. Color signals require three separate video output signals from a matrix of many cells where each cell is comprised of three different color filtered light sensing areas of the substrate. In contrast, black and white imagers need only two output lines. Further, some applications for video imagers require that the video signals be read out from the imager in either an interlace, a non-interlace or a pseudo-interlace mode.

Thus, a need has arisen for a solid state imaging device that cannot be damaged by inadvertent overexposure as by accidently pointing the camera at the sun. Further, there is a need for such a device which has the flexibility to be easily adapted to either color or black and white applications in either interlaced, non-interlaced or pseudo-interlaced format.

SUMMARY OF THE INVENTION

The invention is an improved architecture for an integrated imaging device that uses pixels arranged in triangular groups of three which groups are interlaced with their apexes interleaved. Each triangular group of pixels has two pixels coupled to one row address line and the "apex" pixel coupled to an adjacent row address line. The triangular groups are interleaved such that the row address line coupled to two pixels in one group is coupled to only the apex pixels of the two triangular groups of pixels on either side in the same row of three pixel groups. As a further part of the organization of the imaging device, independent row addressing circuits are placed on either side of the array. These circuits are shift registers with outputs which are sequentially activated as a charge packet shifts through the register. Each shift register has its outputs coupled to every other row address line in the array, and each shift register is driven by a different pair of clock signal lines. Variation of the relationship between these clock signals can provide different modes of reading data out of the array. In addition, a pair of horizontal shift registers are located adjacent to the array on either end thereof. A plurality of column lines carrying video signals run through the array with each column line coupled to all the charge storage elements of all the pixels in one column of the array. Each horizontal shift register has sequentially activated outputs as in the case of the vertical shift registers and each is driven by a different pair of clock signals. Each output of one of the horizontal shift registers controls two switching transistors which switch two column lines to two monochrome outputs. Each output of the other horizontal shift register controls three switching transistors which couple three of the column lines to three color outputs. For color operation, color filters in three primary colors must be integrated in the array or externally fixed over the pixels. The clock signals to one or the other of the horizontal shift registers may be disabled to select monochrome or color operation.

DETAILED DESCRIPTION OF THE PREFERRED EMBODIMENT

Figure 1:
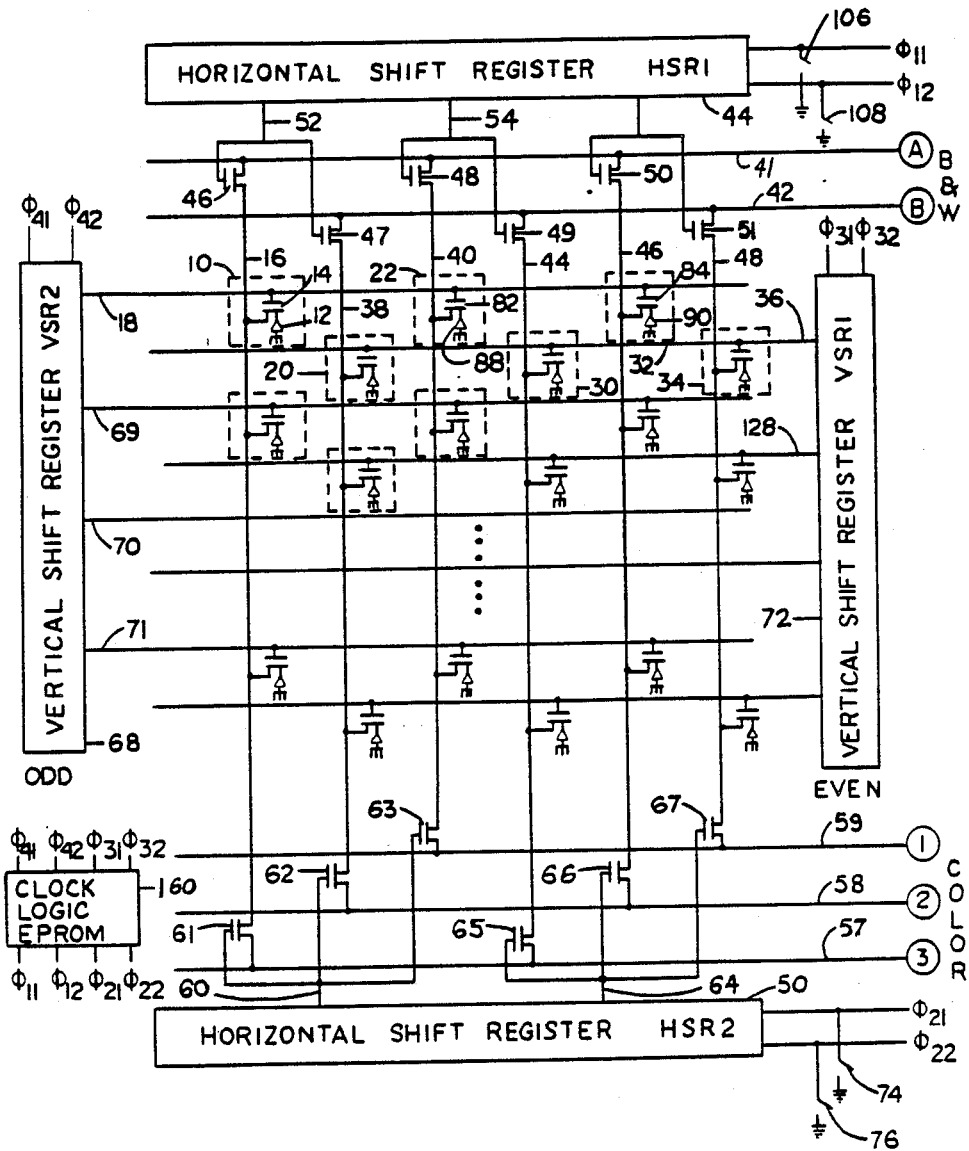
FIG. 1 shows the organization of the MOS imaging device of the invention.

FIG. 1 shows the organization of the MOS imager of the invention. A typical pixel element is represented by the block 10. Each pixel is comprised of a PN diode 12 which is exposed to light from a scene and which generates photoelectric pairs of holes and electrons. This charge is stored in the junction capacitance of the diode or some other storage capacitance until it is time to read the signal from the pixel. The amount of charge generated in each pixel depends upon the intensity of the light from the scene falling on that pixel.

The charge from each pixel is read out by turning on an MOS transistor 14 associated with each diode. The MOS transistor 14 has its source coupled to the cathode of the diode 12 and has its drain coupled to a column video signal line 16. The gate of the MOS transistor 14 is coupled to a row address line 18. When the row address line 18 has a predetermined voltage applied thereto exceeding the threshold voltage of the transistor 14, the MOS transistor 14 turns on and the charge stored in the junction capacitance of the diode 12 is coupled through the channel region of the MOS transistor to the column video signal line 16.

The structure and operation of each pixel are conventional and any design and method of making a conventional MOS imager pixel element will suffice for practicing the invention. For example, the pixel design taught in the Hitachi paper mentioned above will be satisfactory. Alternatively, the cells in either of U.S. Pat. Nos. 4,143,389 or 4,155,094 will be adequate.

The layout of the individual pixels on the substrate is comprised of rows of interleaved triangular groups. That is, the pixels 10, 20 and 22 form a triangular group because pixels 10, 22 and 32 coupled to the first address line 18 are offset from the pixels 20, 30 and 34 in the second row coupled to an address line 36. The offset of the rows is such that the pixels coupled to the address line 36 line up with the gaps between the pixels coupled to the address line 18. Thus triangular groups of three pixels per group are formed where each pixel in each group is coupled to a different one of three column video signal lines which run through the group. For example, the pixel 10 is coupled to the video signal line 16 while the pixels 20 and 22 are coupled to the video signal lines 38 and 40 respectively. This pixel arrangement creates the possibility for generating full color video outputs if 3 different color filters are physically placed over the individual pixel elements in each group. The video signals on the signal lines 16, 38 and 40 then represent the color content signals of a single, composite color pixel comprised of the individual pixels 10, 20 and 22.

The color filters can be implemented using any conventional method. One known way of providing for a color filter is taught in the paper by Aoki et al cited above. There a gelatin layer is deposited over the surface of the substrate after the PN junction diodes and MOS transistors are formed. The gelatin layer is then sectionalized using photolithography techniques and each section over a pixel is dyed with an appropriate one of the colors selected. The color filters may also be discrete filters or "fly eye" filters placed over the pixels. Such structures and the methods of fabricating them are known in the art. Eastman Kodak has published several papers in this area. There are also a number of patents teaching ways of using a single sensor array for color imaging. These patents are: U.S. Pat. No. 3,971,065 to Bayer; U.S. Pat. No. 3,982,274 to Chai; U.S. Pat. No. 4,001,878 to Weimer; U.S. Pat. No. 4,016,597 to Dillon et al.; U.S. Pat. No. 4,042,956 to Yamanaka; U.S. Pat. No. 4,047,203 to Dillon; U.S. Pat. No. 4,153,912 to Gold; U.S. Pat. No. 4,245,241 and U.S. Pat. No. 4,246,601 to Sato et al.; U.S. Pat. No. 4,281,338 to Takahashi et al.; and U.S. Pat. No. 4,293,871 to Macovski.

These patents all teach various configurations of color-responsive or color-sensitive photoelements to produce color related video signals from which a color image can be reconstructed. The photoelements are made color responsive through overlying filters or other known fabrication techniques. Thus each pixel produces a video signal charge packet with a charge which is related in intensity to the intensity of illumination of a particular color of light incident on that element.

The Bayer patent, U.S. Pat. No. 3,971,065, teaches use of a filter mosaic overlying a CCD area image sensor to produce an array of rows and columns of color responsive photoelements with every other array position occupied by a green-sensitive element serving to detect luminance. Red sensitive "chrominance" elements alternate with the luminance detecting elements in every other row while blue sensitive chrominance elements alternate with the luminance elements in the remaining, alternate rows. The luminance and chrominance signals from pairs of the rows provide red, blue and green information with green predominating.

The Dillon Pat. No. 4,047,203 teaches an array wherein every other position of the array of horizontal rows and vertical columns of color responsive pixels is also occupied by a green-sensitive, luminance element. However, the chrominance elements of each row alternate between red and blue along the row so that a pattern of four successive elements, two of which are luminance elements and two of which are different chrominance elements, repeats along the length of each row with one element of horizontal displacements from row to row.

The Takahashi et al. patent U.S. Pat. No. 4,281,338 and the two Sato et al. patents, U.S. Pat. Nos. 4,245,241 and 4,246,601, all owned by Hitachi, Ltd., teach an array wherein the rows of photoelements representing horizontal lines of video are read out and processed two at a time. The signals from four mutually adjacent photoelements, two in each line, are used to create the red, blue and green color information necessary to reproduce the image of the scene in color. These patents disclose photoelements of various color sensitivities in various combinations.

Any of these known ways of making a single sensor array capable of generating color signals will suffice for purposes of the invention.

The monochrome or color versatility is lent by virtue of the use of five video output lines and two horizontal shift registers, one coupled to the top of the video signal lines and one coupled to the bottoms of the signal lines. Two video output lines 41 and 42 carry the monochrome video signals. The output line 41 is coupled to every other one of the video signal lines, i.e., lines 16, 40, and 46. The other video output line 42 is coupled to the remaining ones of the video signal lines 38, 44 and 48. A horizontal shift register 44 causes selected ones of the video signal lines 16, 38, 40, 44, 46 and 48 to be coupled to the video output lines 41 and 42 by the switching action of MOS transistors 46–51. The horizontal shift register 44 has a plurality of outputs 52, 54, etc. each of which is coupled to the gates of two of the MOS transistors 46–51. The MOS transistors 46–51 each have their sources and drains coupled between one of the video signal lines 16, 38, 40, 44, 46 and 48 and one of the video output lines 41 or 42.

By turning on each of two of the MOS transistors 46 through 51 coupled in pairs to the output lines 41 and 42, e.g., the transistors 46 and 47, the two video signal lines 16 and 38 can be coupled to the two video output lines 41 and 42. During the next cycle another two of the transistors, e.g., transistors 48 and 49, are turned on as a different output from the horizontal shift register 44 is activated. This couples a different two of the video signal lines, e.g., the lines 40 and 44, to the output lines 41 and 42.

The horizontal shift register 44 can be any conventional shift register of either the CCD type with driver circuits, flip-flop variety, inverter chains, dynamic source follower chains, or any other known design where successive outputs can be sequentially activated; however, the CCD type is preferred. The structure and operation of shift registers is well known in the art. In the preferred embodiment, the horizontal shift register 44 is a two-phase shift register which shifts a single pulse or charge packet through the register under the influence of two-phased clock signals $\phi_{11}$ and $\phi_{12}$. As the pulse or charge packet shifts past the output line 52, the MOS transistors 46 and 47 are turned on thereby coupling the vertical signal lines 16 and 38 to be coupled to the video output lines 41 and 42 respectively. Similarly, when the pulse or charge packet representing it shifts past the output line 54, the transistors 48 and 49 are turned on and the video signal lines 40 and 44 are thereby coupled to the video output lines 41 and 42.

A second horizontal shift register 56 causes coupling between the video signal lines 16, 38, 40, 44, 46 and 48 and three color video output lines 57, 58 and 59. The second horizontal shift register 56 can be the same structure and operate in the the same fashion as the horizontal shift register 44 except that its output lines are each coupled to the gates of three switching transistors instead of only two as in the case of the shift register 44. That is, an output line 60 is coupled to each of the gates of three MOS switching transistors 61–63. When a pulse or charge packet shifts past the output line 60, the three transistors 61–63 all turn on thereby coupling the video signal lines 16, 38 and 40 to the color video output lines 57–59 respectively. Likewise, the output line 64 operates in the same manner in conjunction with switching transistors 65–67 and video signal lines 44, 46 and 48.

The reading of the image array, i.e., outputting the individual pixel signals in the rows and columns, can be accomplished in several ways by virtue of the use of two vertical shift registers which are coupled to alternate address lines in the array. For example, a vertical shift register 68, having the same structure as the horizontal shift registers 44 and 56, has its outputs coupled to every other address line in the array. That is, the outputs from the vertical shift register 68 are the address lines 18 and 69–71. These address lines are coupled to the gates of the MOS switching transistors for the pixels in every other row.

Interleaved between the above mentioned rows of address lines ("odd"), are a set of "even" row address lines. The even rows address lines are the output lines of a vertical shift register 72. The vertical shift register 72 has the same structure as the horizontal shift registers 56 and 44 and operates in the same manner.

A variety of scanning modes are available by virtue of the above defined organization for the imager. For example, in monochrome operation, non-interlaced, interlaced or pseudo-interlaced readout is available. Monochrome operation is achieved where there are no color filters over the image array and where the horizontal shift register 56 is deactivated such as by closing switches 74 and 76. As a practical matter the switches 74 and 76 are symbolic only and they represent any of a number of different possibilities for deactivating the shift register. Typically the switches 74 and 76 would be MOS switching transistors that are connected either to disconnect the clock signals $\phi_{21}$ and $\phi_{22}$ from the clock inputs of the horizontal shift register 56 or to ground the clock signals. The horizontal shift register 44 has a similar set of switches 106 and 108 to deactivate it for color operation. With the horizontal shift register 56 deactivated, the switching transistors 61–63 and 65–67 are open circuits and the video output lines 57–59 are therefore deactivated. This leaves only the output lines 41 and 42 activated for monochrome operation.

Figure 2:
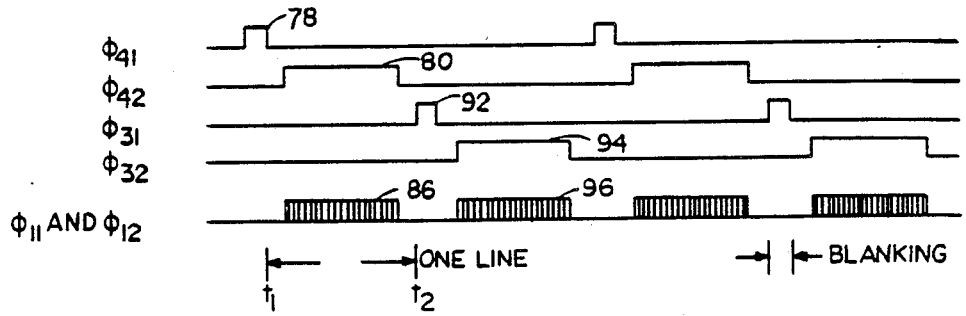
FIG. 2 is a timing diagram of the non-interlace, monochrome mode of operation.

Monochrome readout occurs in the non-interlaced mode as shown in FIG. 2 and described below. The non-interlace mode means that first an even row is read out and then the next odd row is read out. This even-odd-even-odd read-out continues until the entire array has been read out. In FIG. 2 this sequence of events is shown inferentially by the relationships depicted between the signals shown. The $\phi_{41}$ and $\phi_{42}$ signals drive the vertical shift register 68 in the known manner for two-phase registers. The pulses 78 and 80 represent the two pulses necessary to move the pulse or charge packet from one register stage to the next. The pulses 78 and 80 can be thought of as transferring the single pulse or charge packet in the vertical shift register 68 into the first register stage so as to charge the first odd address line 18.

When the first odd address line 18 is charged with the appropriate polarity of charge for the types of switching transistors such as the transistor 14, switching transistors 14, 82 and 84 turn on. For N-channel technology, a positive charge on the address lines will turn on the transistors in each pixel connected to the positively charged line. When the switching transistors of the first address line 18 turn on, the charge stored in each diode junction capacitance in the associated pixels is dumped into the associated one of the video signal lines 16, 40 and 46. That is, the charge stored in the junction capacitance of the diode 12 is dumped into the video signal line 16 and so on for the other pixels associated with the address line 18.

The signals on the video signal lines 16, 40 and 46 must be connected to the black and white video output line 41. This happens sequentially under the influence of the horizontal shift register 44 which is driven by the clock signals $\phi_{11}$ and $\phi_{12}$. These clock signals are represented by the numerous vertical lines within the rectangular region 86 in FIG. 2. These lines represent two clock pulses $\phi_{11}$ and $\phi_{12}$ for each output line 52, 54, etc. from the shift register 44. When the single pulse or charge packet in the shift register 44 is stored in the register stage associated with the output line 52, the transistor 46 turns on and the video signal line 16 is coupled to the video output line 41. A video output signal can then be read from video output line 41 representing the light intensity falling on the pixel consisting of the transistor 14 and the diode 12. One cycle later, the horizontal shift register 44 turns on the transistor 48 and the transistor 46 will turn off. At that time, the video signal from the pixel comprised of the transistor 82 and the diode 88 is coupled through the video signal line 40 and the transistor 48 to the video output line 41. One cycle later the horizontal shift register 44 turns on the transistor 50 and turns off the transistor 48 thereby coupling the pixel comprised of the transistor 84 and the diode 90 to the video output line 41.

After all the pixels in the first odd row connected to the address line 18 are read, which occurs during the interval from t1 to t2 in FIG. 2, clock pulses 92 and 94 occur in the signals $\phi_{31}$ and $\phi_{32}$ to activate the next row of pixels. A blanking interval occurs between the series of clock pulses represented by the blocks 86 and 96 for retrace to the beginning of the next horizontal line by the sweep circuitry in the video equipment used to display the output signals from the invention. These pulses represent the first transfer of the single pulse or charge packet in the vertical shift register 72. These two pulses cause the charge packet to be transferred into the register stage in the shift register 72 (not shown) which is associated with the first even address line 36. Thus all the switching transistors connected to the address line 36 are turned on. The horizontal shift register 44 then sweeps out all the signals from the pixels connected to the address line 36 by turning on in sequence, the transistors 47, 49 and 51 respectively connected to the video signal lines 38, 44 and 48. This process of clocking out the signals is represented by the vertical lines inside the rectangular region 96 in FIG. 2 representing the individual clock pulses $\phi_{11}$ and $\phi_{12}$. This pattern is repeated for all the rows in the array.

Figure 3:
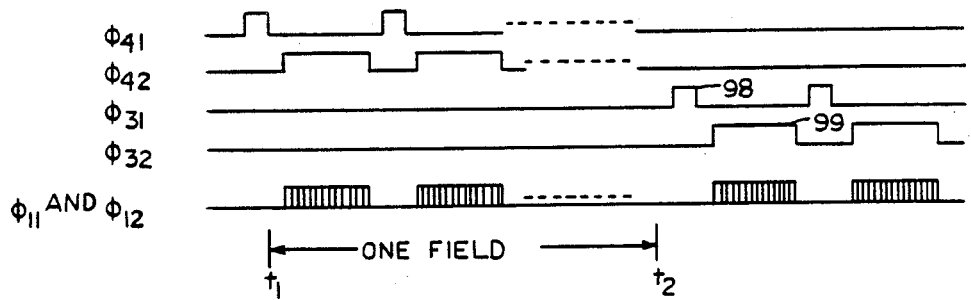
FIG. 3 is a timing diagram of the interlace, monochrome operation.

FIG. 3 represents the interlaced readout mode for monochrome operation. Again the horizontal shift register 56 is deactivated by the switches 74 and 76. In the interlace mode, first all the odd rows are read out for one field and then all the even rows are read out for the next field. This is indicated in FIG. 3 by the absence of any pulses in the $\phi_{31}$ and $\phi_{32}$ signals until the $\phi_{41}$ and $\phi_{42}$ clock pulses have activated each of the odd address lines connected to the vertical shift register 68. The first field is read out between the times t₁ and t₂. The next field readout begins after the time t₂ upon the occurrence of the pulses 98 and 99 in the signals $\phi_{31}$ and $\phi_{32}$.

Figure 4:
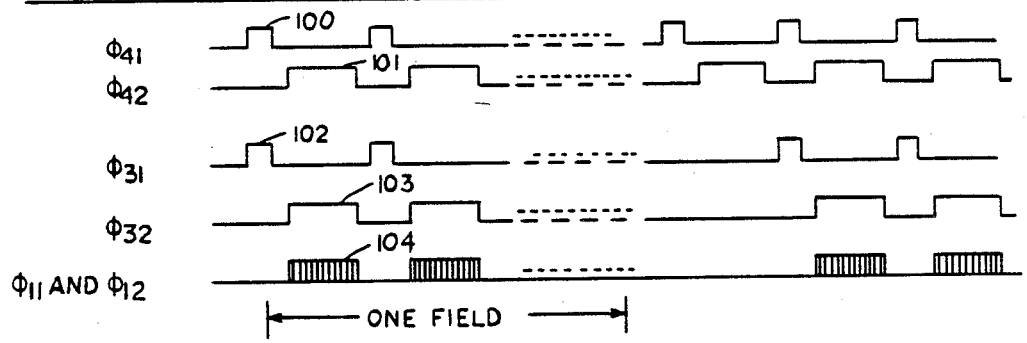
FIG. 4 is a timing diagram of the pseudo-interlace, monochrome mode of operation.

FIG. 4 represents the pseudo-interlace, monochrome mode of operation. In the pseudo-interlace mode of operation, the odd and even rows are read out simultaneously as pairs. This is represented in FIG. 4 by the simultaneous occurrence of the pulses 100 and 102 in the $\phi_{41}$ and $\phi_{31}$ signals and the simultaneous occurrence of the pulses 101 and 103 in the $\phi_{42}$ and $\phi_{32}$. The simultaneous occurrence of pulses 101 and 103 causes the first odd address line 18 and the first even address line 36 to be simultaneously charged so as to turn on all the switching transistors connected to these two rows. The $\phi_{11}$ and $\phi_{12}$ pulses represented by the vertical lines in the rectangular area 104 then sweep the individual pixel signals out on the video output lines 41 and 42. The odd pixels connected to the address line 18 are swept out on the video output line 41 while the even pixels connected to the address line 36 are simultaneously swept out on the video output line 42.

Figure 5:
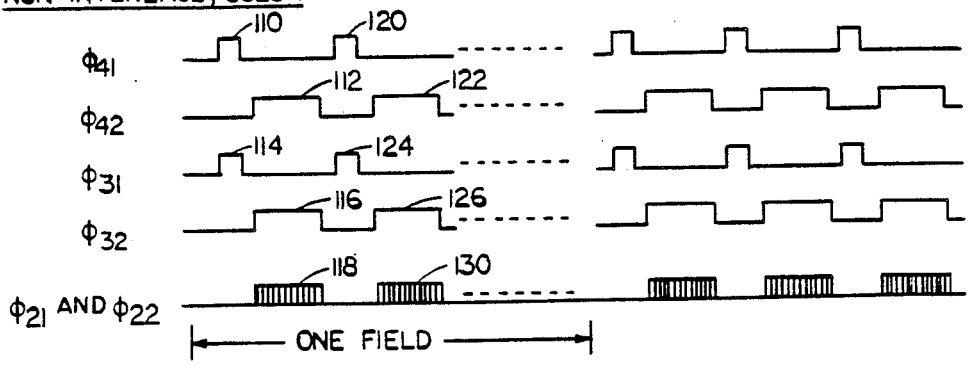
FIG. 5 is a timing diagram of the non-interlace color mode of operation.

FIG. 5 is a timing diagram for the non-interlace, color mode of operation. In this mode, the horizontal shift register 44 is deactivated by the action of circuitry represented by switches 106 and 108 similar to the circuitry represented by the switches 74 and 76. Thus, the video output lines 57–59 are activated. In the color mode three pixels are lumped together as one composite pixel and each pixel in the trio generates one of the three primary color signals in the composite video. The non-interlace mode means each row is read out in the sequence odd-even-odd . . . until all rows have been read out.

The non-interlace, color readout occurs by simultaneously activating both the odd and the even row address lines for each row of composite color pixels. In FIG. 1 this means that the first row of color composite pixels is read by simultaneously activating the row address lines 18 and 36. This is represented in FIG. 5 by the pulses 110 and 112 which activate the row address line 18 and the simultaneous pulses 114 and 116 which activate the row address line 36. The vertical lines within the region 118 of the representation of the signals $\phi_{21}$ and $\phi_{22}$ in FIG. 5 represent the individual pulses from the horizontal shift register 56 which activate the output lines 60 and 64 and the associated switching transistors. The pulse which activates the line 60 turns on the transistors 61–63 which couples the video signal lines 16, 38 and 40 to the video output lines 57–59 respectively. This process of coupling all the video signal lines in the array to the video output lines 57–59 continues during the duration of the pulses 112 and 116 until all the video signal lines in the array have been coupled in turn to their respective color video output lines 57–59.

The next row of composite color pixels is read out when pulses 120 and 122 in the $\phi_{41}$ and $\phi_{42}$ signals and the pulses 124 and 126 are simultaneously active thereby activating the next pair of row address lines 69 and 128. Again, the pulses represented by the region 130 of the $\phi_{21}$ and $\phi_{22}$ signals cause each of the trios of video signal lines in the array to be coupled to the color video output lines 57–59 in turn beginning with the trio of line 16, 38 and 40. This process continues until all the pixels are read.

Figure 6:
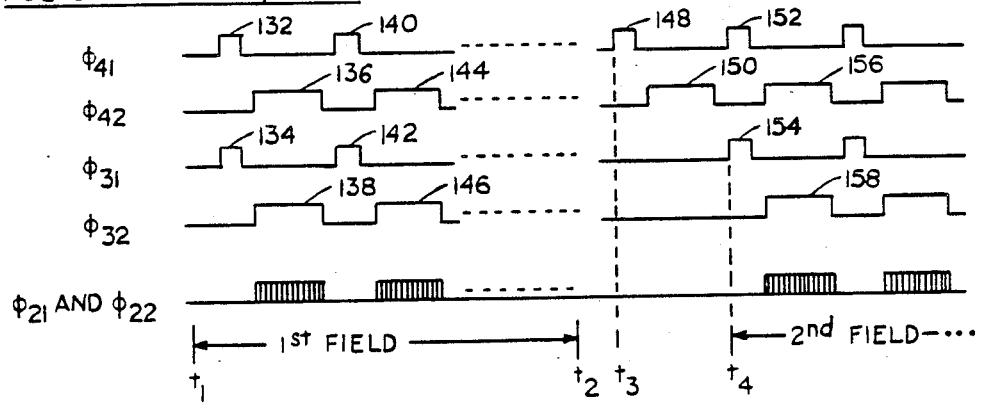
FIG. 6 is a timing diagram of the pseudo-interlace, color mode of operation.

FIG. 6 is a timing diagram of the pseudo-interlace mode of color operation for the invention. In this mode of operation, the horizontal shift register 44 is deactivated by the action of the circuitry represented by the switches 106 and 108. The color output lines 57–59 are thus activated and are coupled to trios of the video signal lines in the same manner as described in connection with FIG. 5. The difference in operation between FIG. 5 and FIG. 6 is that in FIG. 5 during each field both of the row address lines for each row of composite color pixels are simultaneously activated. However, in FIG. 6 in every other field one of the row address activation signals lags the other by one period such that the pairing of pulses is different in every other field. That is, the first field in FIG. 6 extends from t₁ to t₂ and the second field begins at t₄. In the first field the simultaneous occurrence of the pulses 132 and 134 in the signals $\phi_{41}$ and $\phi_{31}$ and the simultaneous occurrence of the pulses 136 and 138 in the signals $\phi_{42}$ and $\phi_{32}$ respectively indicate that in this first field the row address lines 18 and 36 are energized as a pair. The simultaneous occurrence of the pulses 140 and 142 in the signals $\phi_{41}$ and $\phi_{31}$ and the pulses 144 and 146 in $\phi_{42}$ and $\phi_{32}$ indicate that for readout of the next row of composite color pixels, the row address lines 69 and 128 are activated simultaneously as a pair.

In the second field however the pulses in the signals $\phi_{31}$ and $\phi_{32}$ are staggered by one cycle from the pulses in the signals $\phi_{41}$ and $\phi_{42}$. That is, it can be seen that the pulse 148 in the signals $\phi_{41}$ at the time t₃ has no simultaneous counterpart in the signal $\phi_{31}$ at time t₃. Likewise the pulse 150 in $\phi_{42}$ has no counterpart in the signal $\phi_{32}$.

However at time $t_4$ the readout of field two commences. During this readout the simultaneous occurrence of the pulses 152 and 154 and the simultaneous occurrence of the pulses 156 and 158 indicates that different pairings of simultaneous row address line activations are occurring. For example the pulses 152, 154, 156 and 158 simultaneously activate the row address lines 69 and 36. This is a different pair of row address lines than the first pair in field one. This new pairing causes the pixels in the rows connected to these address lines to be read out as the first row of composite color pixels in the field two video signal appearing on the lines 57–59. The operation of the horizontal shift register 56 in this mode of operation is the same as described with reference to FIG. 5.

The signals $\phi_{41}$, $\phi_{42}$, $\phi_{31}$ and $\phi_{32}$ driving the vertical shift registers 68 and 72 and the signals $\phi_{11}$, $\phi_{12}$, $\phi_{21}$ and $\phi_{22}$ driving the horizontal shift registers 44 and 56 are generated by conventional clock logic 160 in the form of an EPROM. The design of this clock logic 160 is not critical to the invention and any design which supplies the signals shown in FIGS. 2-6 in the relationships there shown will suffice for purposes of the invention. The pattern of signals generated by the clock logic 160 and their relationships can be set by any conventional means such as by supplying external signals to the clock logic to set internal latches to define the desired mode. Alternatively this could be done by blowing fuses in the EPROM clock logic 160 during fabrication as with a laser by techniques similar to the techniques used to replace defective circuits in integrated memories by patching in redundant circuits on the die.

Although the invention has been described in terms of the preferred embodiment, it will be apparent to those skilled in the art that numerous alternative means are available to reach the same result. All such modifications are intended to be within the scope of the claims appended hereto.

What is claimed is:

1. An imaging device having monochrome and color outputs comprising:
    an array of rows and columns of light sensing elements;
    a first addressing circuit for activating the light sensing elements in selected ones of said rows at selected times;
    a second addressing circuit for activating the light sensing elements in selected ones of said rows at selected times;
    first switch means coupled to said light sensing elements in said columns for connecting selected groups of said columns of light sensing elements sequentially to said monochrome output upon receipt of a first signal;
    second switch means coupled to said light sensing elements in said columns for connecting selected groups of said columns of light sensing elements sequentially to said color output upon receipt of a second signal;
    first control means coupled to said first switch means for supplying said first signal when enabled;
    second control means coupled to said second switch means for supplying said second signal when enabled; and
    enabling means coupled to said first and second control means to enable a user-selected one of said first and second control means while disabling the non-selected control means.

2. An imaging device as defined in claim 1 further comprising a plurality of row address lines and a plurality of column address lines, each of said row address lines and each of said column address lines being for addressing one of said rows and one of said columns of light sensing elements, respectively, and wherein each said light sensing element in each of said rows and each of said columns of light sensing elements comprises a PN junction photodiode and an MOS addressing transistor, wherein said photodiode has its anode coupled through the channel region of the MOS addressing transistor to a corresponding one of said column address lines, each of said column address lines being connected to all of the light sensing elements in a corresponding one of said columns of light sensing elements, and wherein said MOS addressing transistor has its gate connected to a corresponding one of said row address lines.

3. An imaging device as defined in claim 2 wherein said first addressing circuit is connected to every other one of the row address lines in said imaging device.

4. An imaging device as defined in claim 3 wherein said second addressing circuit is connected to the others of said non address lines in said imaging device which are not connected to said first addressing circuit.

5. An imaging device as defined in claim 4 wherein said second addressing circuit is a two-phase shift register.

6. An imaging device as defined in claim 3 wherein said first addressing circuit is a two-phase shift register.

7. An imaging device as defined in claim 2 wherein said first control means comprises a first shift register for shifting a first clock signal therethrough and having a plurality of outputs which are sequentially activated as said first clock signal propagates through said first shift register, and wherein said second control means comprises a second shift register for shifting a second clock signal therethrough and having a plurality of outputs which are sequentially activated as said second clock signal propagates through said second shift register;
    and wherein said first and second switch means are each comprised of a plurality of MOS transistors each having its gate coupled to one of said shift register outputs of said first and second control means respectively, a first group of said transistors coupling selected ones of said column address lines to said monochrome output and a second group of said transistors coupling selected ones of said column address lines to said color output.

8. An imaging device as defined in claim 7 wherein said monochrome output comprises two signal output lines, and wherein said first group of transistors comprises a plurality of pairs of transistors, the transistors of each pair both having their gates connected to one of the outputs of said first shift register, and wherein each transistor of each pair couples a different one of said column address lines to a different one of said signal output lines of said monochrome output.

9. An imaging device as defined in claim 7 wherein said color output comprises three signal output lines, and wherein said second group of transistors comprises a plurality of trios of transistors, the transistors of each trio all having their gates connected to one of the outputs of said second shift register, and wherein each transistor of each trio couples a different one of said column address lines to a different one of said signal output lines of said color output.

10. An MOS imaging device comprising:

an array of rows and columns of MOS imaging pixels having an address line for each row and a video signal line for each column wherein when the address line for any particular row is activated charges stored by the pixels in that row are coupled to corresponding ones of the video signal lines;

a first vertical shift register means coupled to a first plurality of said address lines for activating the address lines in a user-defined sequence;

a second vertical shift register means coupled to the remaining address lines not connected to said first vertical shift register means for activating the remaining address lines in a user-defined sequence;

a first plurality of switching transistors;

a first plurality of output lines having a sufficient number of output lines to serve as a monochrome output;

a second plurality of switching transistors;

a second plurality of output lines having a sufficient number of output lines to serve as a color output capable of supplying signals which can represent all colors;

a first horizontal shift register means for causing coupling between selected ones of said video signal lines and selected ones of said first plurality of output lines through selected ones of said first plurality of switching transistors so as to allow monochrome signals to be generated from the charges stored by the pixels in any particular row or rows of pixels being addressed at any particular time;

a second horizontal shift register means for causing coupling between selected ones of said video signal lines and selected ones of said second plurality of output lines through selected ones of said second plurality of switching transistors so as to allow color signals which can represent all colors to be generated from the charges stored by the pixels in any particular row or rows of pixels being addressed at any particular time with the particular color represented by the color signals being determined by the relative magnitudes of the color signals supplied on the second plurality of output lines;

means for deactivating one of said first and second horizontal shift register means; and means for causing said first and second vertical shift register means to activate said address lines in a predetermined, user-defined sequence such that the user may cause the imaging device to operate in any of an interlaced, an non-interlaced and a pseudo-interlaced mode of operation.

11. A method of reading video signal data from an array of rows and columns of pixels in a video area imaging device, said array having odd and even row address lines coupled respectively to odd and even rows of said pixels and having column signal lines coupled to each column of said pixels, comprising the steps of:

sequentially coupling pairs of said column signal lines to a pair of monochrome outputs; and preventing the sequential coupling of trios of said column signal lines to a trio of color outputs.

12. The method of claim 11 further comprising the step of:

activating sequentially each row address line in said array.

13. The method of claim 12 wherein two shift registers each sequentially activate half the row address lines in said array such that each row address line is activated in sequence wherein one of said two shift registers controls said odd address lines and the other of said two shift registers controls said even address lines.

14. The method of claim 13 wherein a first shift register activates all the even row address lines and a second shift register then activates all the odd row address lines.

15. The method of claim 11 wherein said row address lines are divided into even and odd row address lines and are interlaced in even-odd-even-odd manner and wherein all the even row address lines are activated and then all the odd row address lines are activated.

16. The method of claim 11 wherein the even and odd row address lines are simultaneously activated sequentially such that a first pair of row address lines consisting of one odd and one adjacent even row address line are activated followed by the activation of a second adjacent pair of row address lines consisting of one even and one adjacent odd row address line and so on until all the row address lines have been activated.

17. A method of reading video signal data from an array of rows and columns of pixels in a video area imaging device, said array having odd and even row address lines coupled respectively to odd and even rows of said pixels and having column signal lines coupled to each column of said pixels, comprising the steps of:

sequentially coupling selected trios of said column signal lines to a trio of color outputs;

preventing the sequential coupling of pairs of said column signal lines to a pair of monochrome outputs.

18. The method of claim 17 further comprising the step of sequentially activating both said odd and even row address lines simultaneously in pairs until all the odd and even row address lines have been activated.

19. An imaging device having monochrome and color outputs comprising:

an array of rows and columns of light sensing elements;

a first addressing circuit for activating the light sensing elements in selected ones of said rows at selected times;

a second addressing circuit for activating the light sensing elements in selected ones of said rows at selected times;

means for sequentially connecting each of said columns to either said monochrome output or said color output at any particular time as selected.

* * * * *